United States Patent
Tomohiro et al.

(10) Patent No.: US 7,692,277 B2
(45) Date of Patent: Apr. 6, 2010

(54) MULTILAYERED LEAD FRAME FOR A SEMICONDUCTOR LIGHT-EMITTING DEVICE

(75) Inventors: Hidekazu Tomohiro, Kameoka (JP); Masayuki Fujii, Kyoto (JP); Norio Satou, Kameoka (JP); Tomoyuki Yamada, Kameoka (JP); Tomio Kusano, Kyoto (JP)

(73) Assignee: Panasonic Corporation, Osaka (JP)

( * ) Notice: Subject to any disclaimer, the term of this patent is extended or adjusted under 35 U.S.C. 154(b) by 434 days.

(21) Appl. No.: 10/542,419

(22) PCT Filed: Jan. 13, 2004

(86) PCT No.: PCT/JP2004/000152

§ 371 (c)(1),
(2), (4) Date: Dec. 29, 2005

(87) PCT Pub. No.: WO2004/064154

PCT Pub. Date: Jul. 29, 2004

(65) Prior Publication Data

US 2006/0102936 A1 May 18, 2006

(30) Foreign Application Priority Data

Jan. 16, 2003 (JP) ............................. 2003-007988

(51) Int. Cl.
*H01L 23/495* (2006.01)

(52) U.S. Cl. ............... 257/677; 257/666; 257/E23.054; 438/123

(58) Field of Classification Search ................. 257/676, 257/677, E23.052–E23.054, E23.066, 81, 257/91, 98, 99, 100, E23.041, E23.043
See application file for complete search history.

(56) References Cited

U.S. PATENT DOCUMENTS 4,979,017 A * 12/1990 Mii ............................ 257/676
5,424,578 A * 6/1995 Fujita et al. ................. 257/677
5,670,797 A * 9/1997 Okazaki ....................... 257/91
5,936,264 A * 8/1999 Ishinaga ....................... 257/99
6,352,634 B1 * 3/2002 Forderer et al. ............. 205/181
2001/0022390 A1* 9/2001 Waitl et al. .................. 257/666
2002/0047186 A1* 4/2002 Tellkamp .................... 257/666
2004/0089898 A1* 5/2004 Ruhnau et al. .............. 257/343

FOREIGN PATENT DOCUMENTS

| DE | 198 50 526 A1 | 5/2000 |
| EP | 1 094 519 A1 | 4/2001 |
| JP | 61-078150 | 4/1986 |
| JP | 61-148883 | 7/1986 |
| JP | 62-263665 | 11/1987 |
| JP | 01-305551 | 12/1989 |
| JP | 11-008341 | 1/1999 |
| JP | 11008341 A * | 1/1999 |
| JP | 2001-127229 | 5/2001 |
| JP | 2002-517327 | 6/2002 |
| JP | 2002-335012 | 11/2002 |

OTHER PUBLICATIONS

Japanese Office Action issued in corresponding Japanese Patent Application No. JP 2004-003413, dated Dec. 12, 2006.

* cited by examiner

*Primary Examiner*—Wael Fahmy
*Assistant Examiner*—Sarah K Salerno
(74) *Attorney, Agent, or Firm*—McDermott Will & Emery LLP

(57) ABSTRACT

A lead frame (100) for a semiconductor device is formed by applying nickel plating (102), palladium plating (103), and gold flash plating (104) substantially entirely to lead frame body (101) such as copper thin plate in this order, and further applying silver plating (105) selectively to part of an inner part that is to be enclosed with a package of the semiconductor device. The lead frame (100) may also include a base of the package. The silver plating contributes to an excellent light reflectance and wire bonding efficiency of the inner part, whereas the gold flash plating contributes to an excellent resistance to corrosion and soldering efficiency of an outer part that is outside the package.

24 Claims, 7 Drawing Sheets

MULTILAYERED LEAD FRAME FOR A SEMICONDUCTOR LIGHT-EMITTING DEVICE

TECHNICAL FIELD

The present invention relates to a lead frame for a semiconductor device, and in particular relates to techniques of improving a light reflectance of a lead frame.

BACKGROUND ART

Conventionally, gold-silver alloy flash plating is formed at an outermost layer of a lead frame for a semiconductor device, to ensure a high resistance to corrosion. An example of such techniques is disclosed in Unexamined Japanese Patent Application Publication No. H11-008341.

FIG. 6 is a representation of a construction of a lead frame described in the above document. In the drawing, a lead frame 900 is formed by applying nickel plating 902, palladium plating 903, and gold-silver alloy flash plating 904 to a lead frame body 901 in this order. According to the document, the lead frame 900 having this construction exhibited an excellent corrosion resistance in a salt-spray test.

However, though this construction certainly has a high corrosion resistance, it has only a low light reflectance. This being so, especially when a semiconductor light-emitting element such as an LED is mounted on the lead frame to form a semiconductor light-emitting device, the lead frame cannot sufficiently reflect rear light of the light-emitting element, which impairs the luminous efficiency of the entire device.

DISCLOSURE OF THE INVENTION

The present invention was conceived in view of the problem described above, and aims to provide a lead frame for a semiconductor device with an improved light reflectance. The present invention especially aims to provide a lead frame for a semiconductor light-emitting device.

The stated object can be achieved by a lead frame for a semiconductor light-emitting device, including: a lead frame body; and a plurality of metal coatings which are applied to the lead frame body, the lead frame being characterized in that: a predetermined part of the lead frame is formed by extending one pair of inner leads, which are separated by a gap, toward each other in a state where extended portions of the pair of inner leads are flat and flush with each other, the predetermined part being to be enclosed with a package of the semiconductor light-emitting device; and the plurality of metal coatings include a silver or silver-alloy coating which is an outermost metal coating of the pair of inner leads.

Here, the silver or silver-alloy coating may have a thickness of 0.1 μm or more.

Here, a base that is a part of the package may be inserted to the lead frame with a portion of the predetermined part being enclosed with the base.

According to these constructions, the silver or silver-alloy coating delivers an excellent light reflectance and wire bonding efficiency of the predetermined part which is enclosed with the package.

Thus, the lead frame exhibits a high light reflectance in the predetermined part. Accordingly, when used in a semiconductor light-emitting device, the lead frame efficiently reflects rear light of a semiconductor light-emitting element, with it being possible to enhance the luminous efficiency of the entire device.

Here, the plurality of metal coatings may further include a gold or gold-alloy coating, a nickel or nickel-alloy coating, and a palladium or palladium-alloy coating, wherein the nickel or nickel-alloy coating, the palladium or palladium-alloy coating, the gold or gold-alloy coating, and the silver or silver-alloy coating are applied in the stated order, with the nickel or nickel-alloy coating and the palladium or palladium-alloy coating substantially entirely covering the lead frame body.

According to this construction, the palladium or palladium-alloy coating has a high high-temperature stability, which makes the lead frame suitable for high-temperature leadless soldering.

Here, the plurality of metal coatings may further include a gold or gold-alloy coating, wherein the silver or silver-alloy coating substantially entirely covers the lead frame body, and the gold or gold-alloy coating is applied over the silver or silver-alloy coating only in a part of the lead frame other than the predetermined part (FIG. 7).

According to this construction, the gold or gold-alloy coating partially covers the lead frame body, whereas the silver or silver-alloy coating entirely covers the lead frame body. This simplifies the manufacturing process of the lead frame.

Here, the plurality of metal coatings may further include a nickel or nickel-alloy coating and a palladium or palladium-alloy coating, wherein the nickel or nickel-alloy coating, the palladium or palladium-alloy coating, the silver or silver-alloy coating, and the gold or gold-alloy coating are applied in the stated order, with the nickel or nickel-alloy coating and the palladium or palladium-alloy coating substantially-entirely covering the lead frame body.

According to this construction, the palladium or palladium-alloy coating has a high high-temperature stability, which makes the lead frame suitable for high-temperature leadless soldering.

Here, the silver or silver-alloy coating may be applied except at least one part of the portion enclosed with the base.

According to this construction, the adhesion between the lead frame and a resin that forms the package is strong in the area where the silver or silver-alloy coating is absent in the predetermined part. This maintains the seal of the package and improves the resistance to corrosion in the predetermined part.

Here, a semiconductor light-emitting element may be mounted on the lead frame to form the semiconductor light-emitting device.

According to this construction, the semiconductor light-emitting device is formed using the lead frame that has an excellent light reflectance in the predetermined part. This makes it possible to efficiently reflect rear light of the semiconductor light-emitting element, which contributes to a high luminous efficiency of the entire device.

BEST MODE FOR CARRYING OUT THE INVENTION

Figure 1:
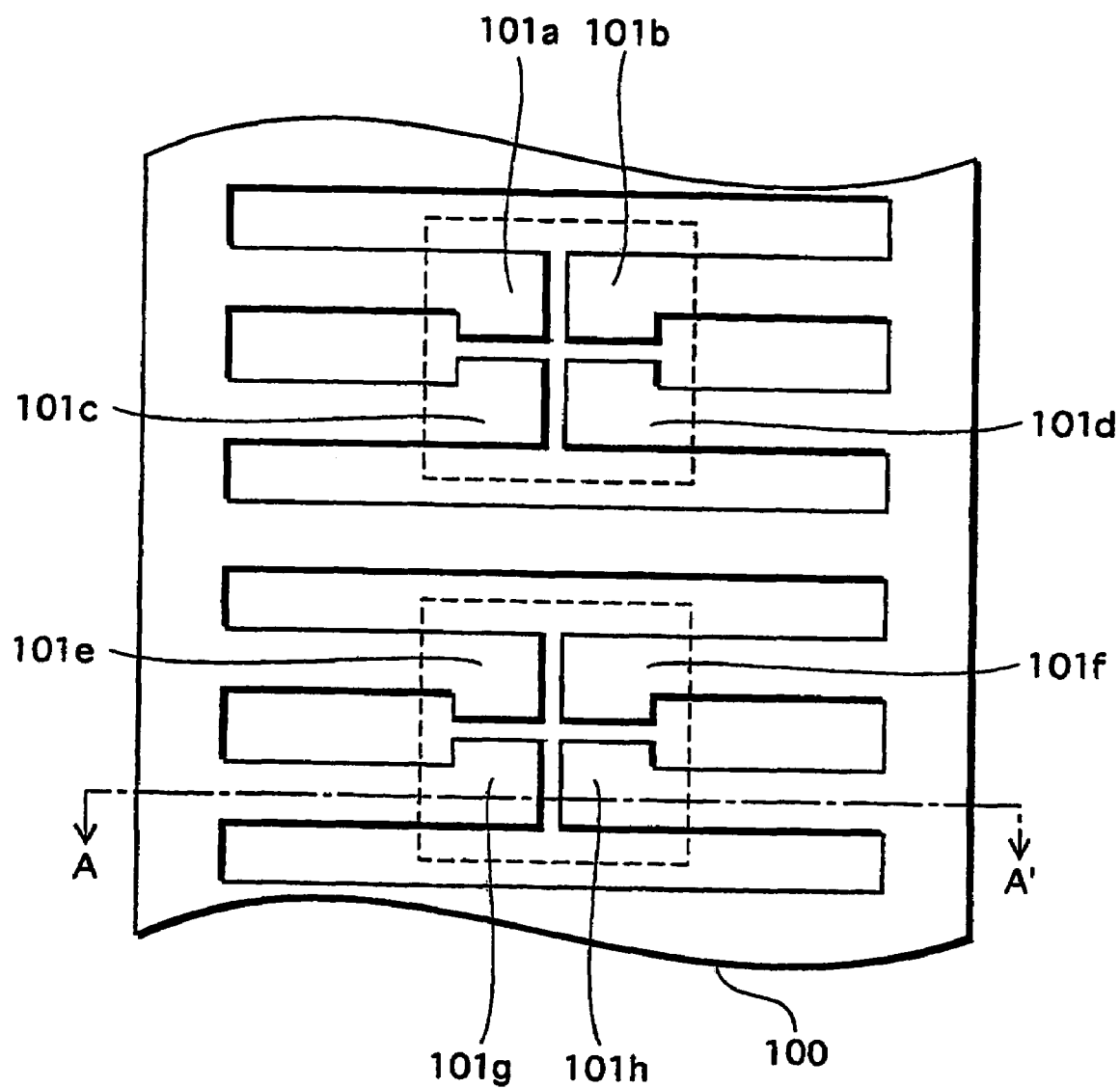
FIG. 1 is a top view of a lead frame to which an embodiment of the invention relates.

An embodiment of the present invention is described in detail below, by referring to the drawings.

(Pattern of a Lead Frame)

FIG. 1 is a top view of a lead frame to which the embodiment of the present invention relates.

In the drawing, a lead frame 100 is formed by pressing or etching a lead frame body in the illustrated pattern and then plating the lead frame body as described later. For example, the lead frame body is a thin plate of an iron alloy or a copper alloy.

A package for enclosing part of the lead frame 100 and housing a semiconductor element such as a semiconductor light-emitting element is provided in each of the areas indicated by the dashed line boxes. The package includes a base and a cover. The base has a depression for mounting the semiconductor light-emitting element. The cover seals the depression on which the semiconductor light-emitting element is mounted.

In this specification, a part of the lead frame 100 which is inside each of the areas indicated by the dashed line boxes, i.e. which is enclosed with the package, is called an inner part, whereas a part of the lead frame 100 which is outside the package is called an outer part. The inner part includes inner leads. In FIG. 1, reference numerals 101a, 101b, 101c, 101d, 101e, 101f, 101g, and 101h represent inner leads. As can be understood from the drawing, the pair of inner leads 101a and 101b are separated by a gap and extended in a direction toward each other. The pair of inner leads 101c and 101d, the pair of inner leads 101e and 101f, and the pair of inner leads 101g and 101h are also separated by a gap and extended toward each other. The extended ends of the inner leads 101a, 101b, 101c, 101d, 101e, 101f, 101g, and 101h are widened as shown in the drawing. These extended ends serve as element mounting units (see FIG. 4). Which is to say, one semiconductor light-emitting element is to be mounted either on one of the extended ends of the pair of inner leads 101a and 101b or over the extended ends of the pair of inner leads 101a and 101b. Here, the upper surfaces of the pair of inner leads 101a and 101b are flat and flush with each other, as illustrated. The same applies to the pair of inner leads 101c and 101d, the pair of inner leads 101e and 101f, and the pair of inner leads 101g and 101h.

(Plating)

Figure 2:
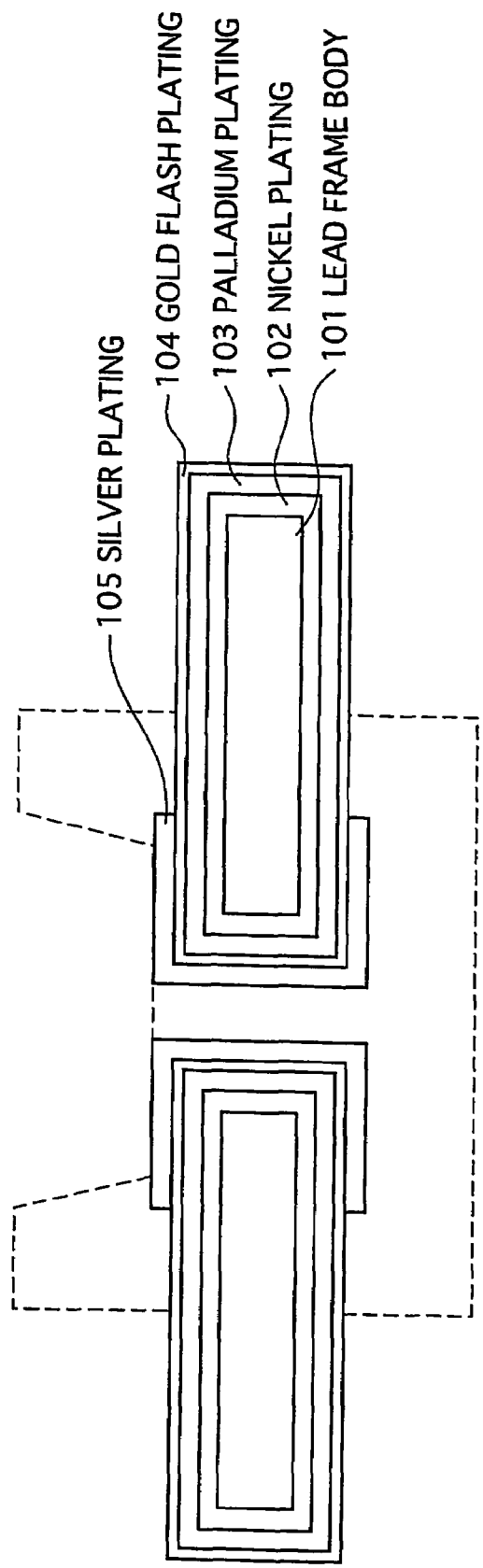
FIG. 2 is a representation of a plating construction of the lead frame shown in FIG. 1.

FIG. 2 is a representation of a plating construction of the lead frame 100, taken along the lines A-A' in FIG. 1.

The lead frame 100 is formed by applying nickel plating 102, palladium plating 103, and gold flash plating 104 to a lead frame body 101 in this order, and further applying silver plating 105 to part of the inner part.

For example, the nickel plating 102 has a thickness of 0.5 to 2.0 μm, the palladium plating 103 has a thickness of 0.005 to 0.07 μm, the gold flash plating 104 has a thickness of 0.003 to 0.01 μm, and the silver plating 105 has a thickness of 0.1 μm or more.

Here, these plating layers may instead be made of alloys. Which is to say, the nickel plating 102 may be nickel-alloy plating, the palladium plating 103 may be palladium-alloy plating, the gold flash plating 104 may be gold-alloy flash plating, and the silver plating 105 may be silver-alloy plating.

After plating, the base of the package is inserted to the area indicated by the dashed lines. The base is made of a white-colored or light-colored insulating resin, such as polyphthalamide. The base has a depression as shown in the drawing, and releases light of the semiconductor light-emitting element placed in the depression in an upward direction. After the semiconductor light-emitting element is placed in the depression, the depression is filled with a sealing transparent resin (e.g. an epoxy resin) to form the cover. The base and the cover together constitute the package.

It should be noted here that the silver plating 105 only partially covers the inner part, i.e., the part of the inner part enclosed with the base is partially not plated with silver.

(Semiconductor Device Using the Lead Frame 100)

Figure 3:
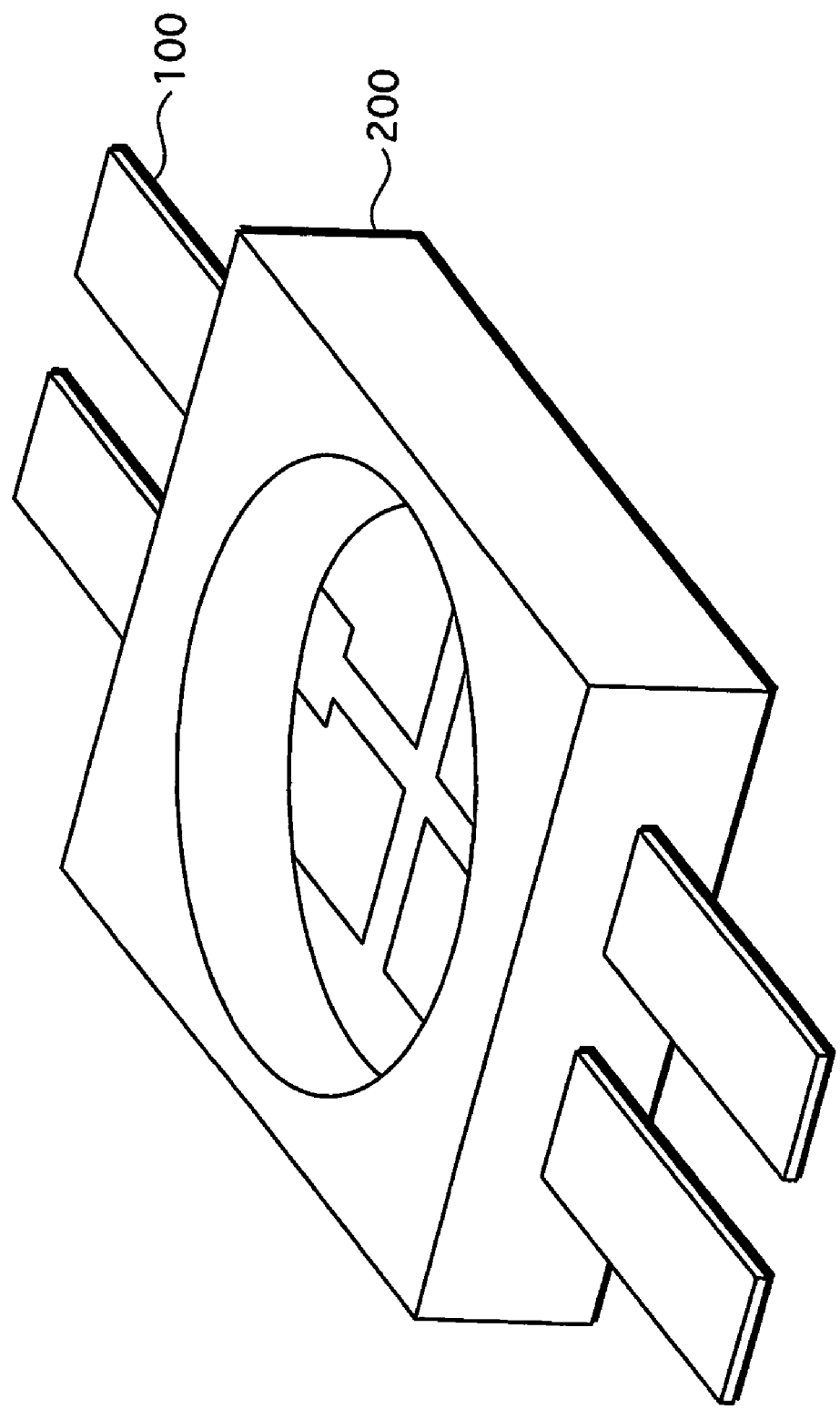
FIG. 3 is a perspective view of the lead frame after a package is formed.

FIG. 3 is a perspective view of the lead frame 100 after a base 200 is formed.

Figure 4:
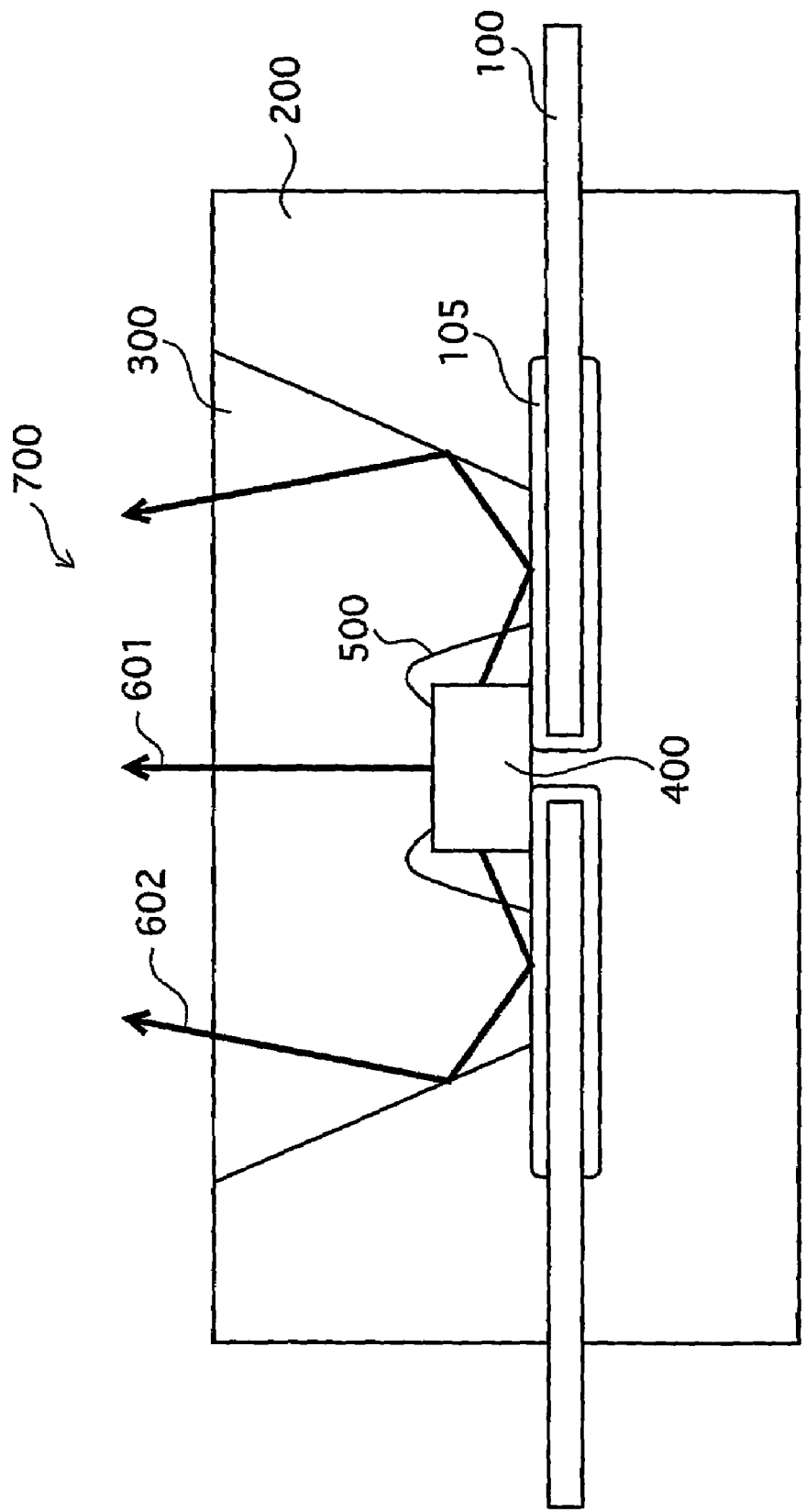
FIG. 4 is a representation of a cross section of a semiconductor light-emitting device that uses the lead frame.

FIG. 4 is a representation of a cross section of a semiconductor light-emitting device 700 which uses the lead frame 100.

The semiconductor light-emitting device 700 is formed by mounting a semiconductor light-emitting element 400 on part of the inner part exposed to the depression of the base 200, connecting the semiconductor light-emitting element 400 with the inner part using bonding wires 500, and then enclosing a transparent resin 300 in the depression to form a cover.

Light 601 of the semiconductor light-emitting element 400 is directly released upward, whereas other light 602 of the semiconductor light-emitting element 400 is reflected off the inner part and the base 200 and then released.

The inventors of the present invention confirmed that such a constructed lead frame has the following excellent properties.

(Light Reflectance)

Figure 5:
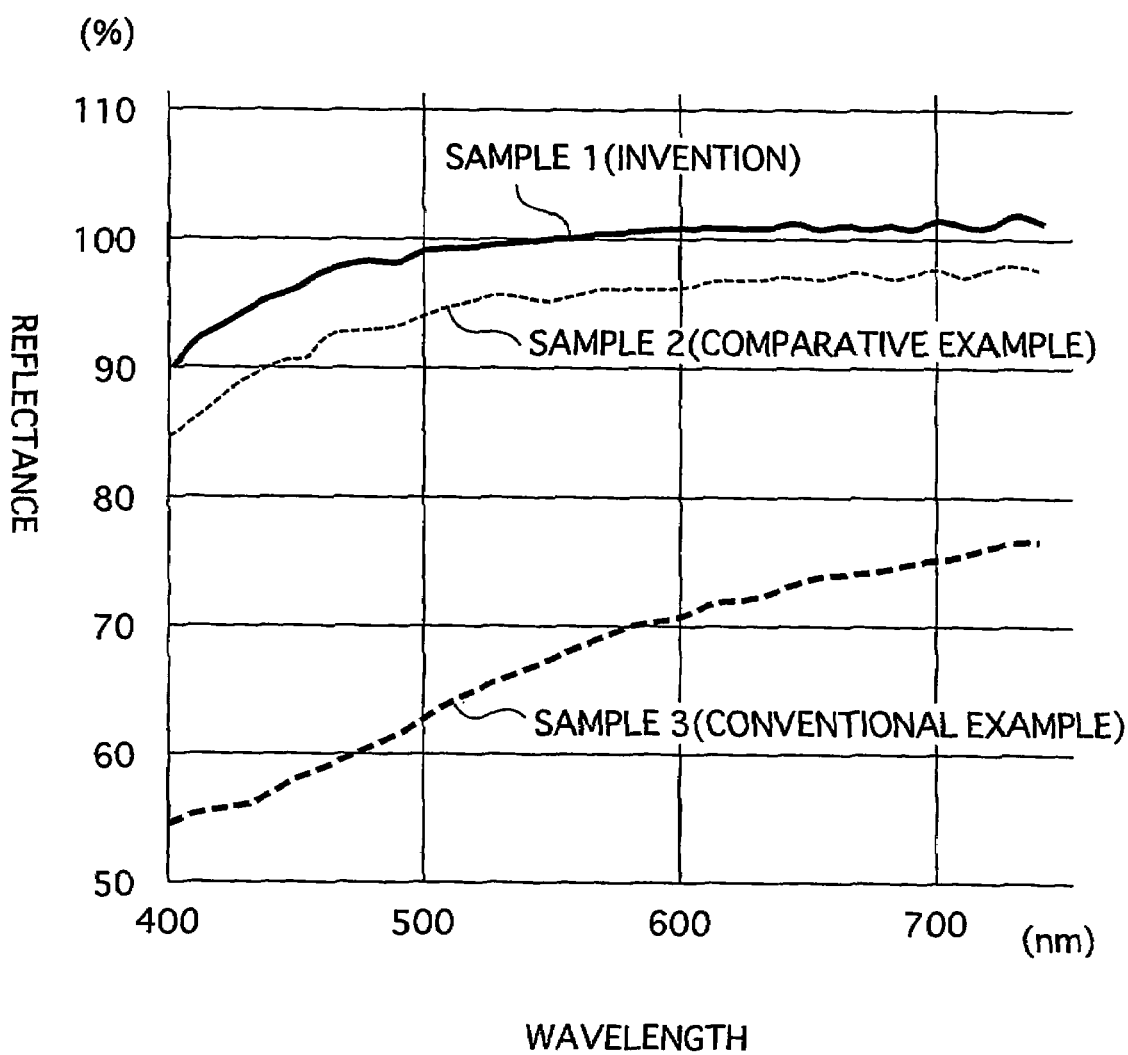
FIG. 5 is a graph for comparing reflectances of lead frames.
Figure 6:
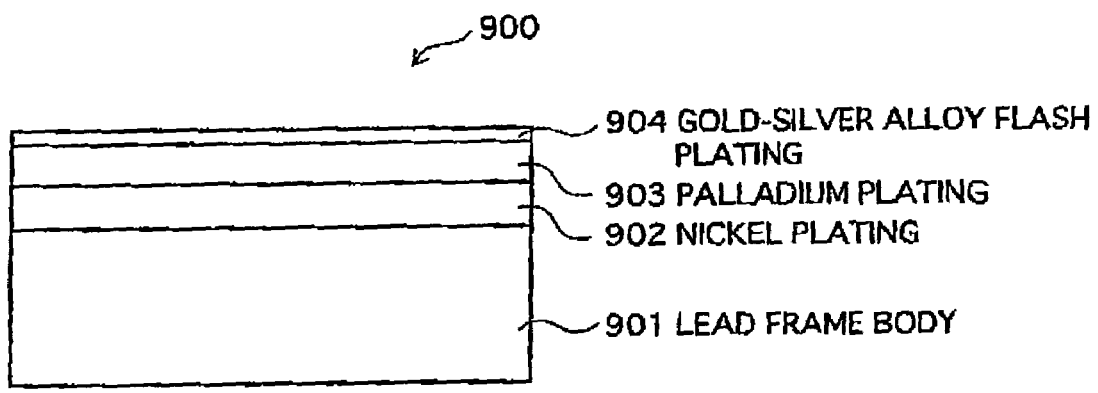
FIG. 6 is a representation of a plating construction of a conventional lead frame.
Figure 7:
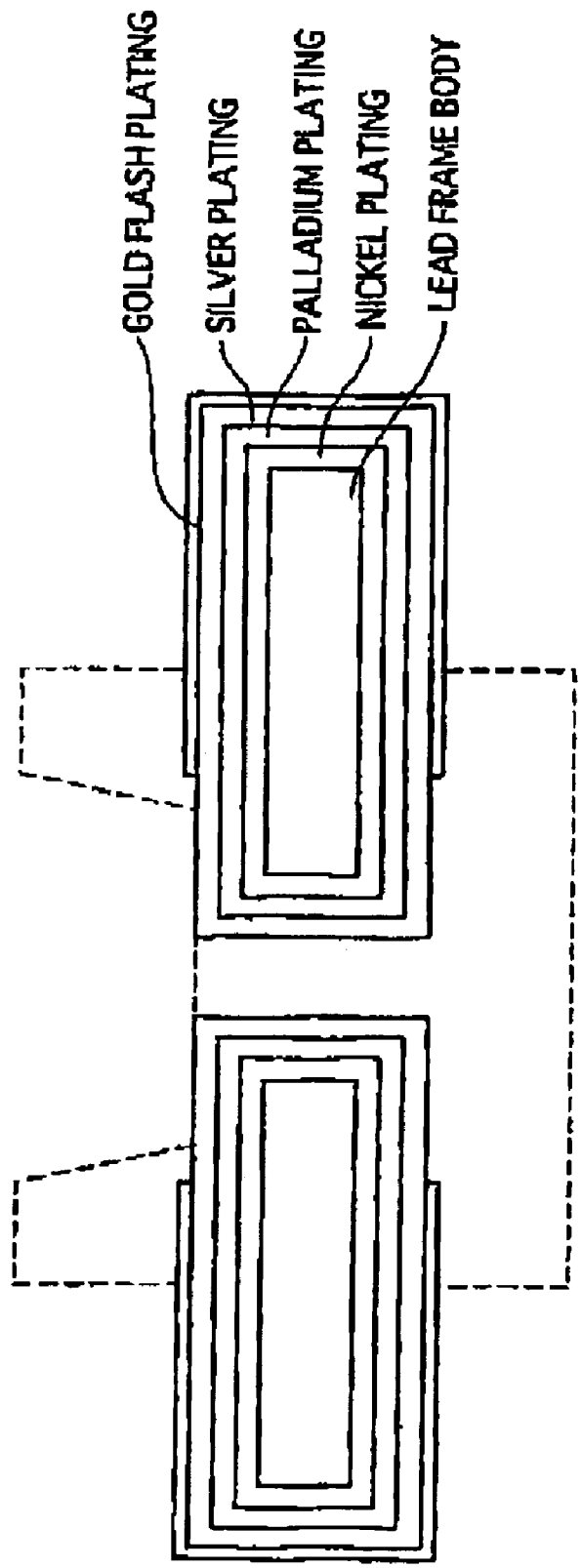
FIG. 7 is a representation of a plating construction of the lead frame of the present invention.

FIG. 5 is a graph for comparing light reflectances of lead frames. A light reflectance of a lead frame of each of sample 1 (the silver-plated lead frame part of the present invention), sample 2 (a comparative example), and sample 3 (a conventional example) was measured using a visible-ultraviolet spectrophotometer, where a light reflectance of barium sulfate is 100.

Sample 1 has the construction described above.

Sample 2 is formed by applying copper strike plating and silver plating that has a thickness of 3 μm to a copper alloy thin plate as a lead frame body, in this order. Sample 2 is used as a comparative example that can deliver a light reflectance similar to the present invention, by single-layer silver plating.

Sample 3 is a conventional lead frame. Sample 3 is formed by applying nickel plating of 1.0 to 1.2 μm in thickness, palladium plating of 0.03 μm in thickness, and gold flash plating of 0.008 μm in thickness to a copper alloy thin plate as a lead frame body, in this order.

As shown in the graph, the silver-plated lead frame part of the present invention has a light reflectance that is at least 25% higher than that of the conventional example and a little higher than that of the comparative example, for visible light of 400 to 700 nm in wavelength.

(Resin Adhesiveness)

Also, the inventors of the present invention measured a shear adhesive strength of the contact surfaces of a resin which forms the base and a palladium-plated lead frame part and a shear adhesive strength of the contact surfaces of the resin and a silver-plated lead frame part. As a result, the inventors found that the shear adhesive strength of the resin and the palladium-plated lead frame part is greater than that of the resin and the silver-plated lead frame part. In view of this, silver plating is provided only partially in the inner part, that is, silver plating is provided in the inner part except a part of the area that is enclosed with the base.

As a result, the resin adheres to the palladium plating layer through the gold flash plating layer, in the portion of the inner part which is not plated with silver. This produces a greater shear adhesive strength than in the portion of the inner part which is plated with silver. Since the gold flash plating layer is extremely thin, it does not significantly affect the shear adhesive strength.

The inventors of the present invention conducted an experiment of soaking samples 1 and 2 in red ink under the same conditions. As a result, red ink did not seep into sample 1 which is not plated with silver in part of the area enclosed with the base, whilst red ink seeped into sample 2 which is entirely plated with silver.

(Other Properties)

In addition, each of the plating layers of the lead frame has the following excellent properties.

The silver plating not only achieves an excellent light reflectance as described above, but also has excellent connectivity with the semiconductor light-emitting element mounted thereon and a high wire bonding efficiency.

The gold flash plating has a high thermal stability, which enhances the soldering efficiency of the outer part.

The palladium plating has a high chemical stability, and so exhibits an excellent resistance to corrosion under high-temperature environments.

The nickel plating serves as base plating, and contributes to a high wire bonding efficiency, a high leadless soldering efficiency, a high corrosion resistance, and a high adhesive strength with the resin that forms the package.

As described above, the lead frame of the present invention has a characteristic construction in which silver or silver-alloy plating is applied as the outermost coating of the inner part, to achieve a favorable light reflectance.

In the above embodiment, this characteristic construction is realized by coating the lead frame body substantially entirely with nickel plating, palladium plating, and gold flash plating in this order, and further coating the inner part of the lead frame with silver plating. However, the construction of the present invention can equally be realized by coating the lead frame body substantially entirely with nickel plating, palladium plating, and silver plating, and further coating the outer part of the lead frame with gold flash plating. Hence this lead frame is included in the present invention, too.

In the above embodiment, each of the metal coatings applied to the lead frame body is referred to as plating for the sake of simplicity. However, the metal coating method of the present invention is not limited to plating. For example, the metal coatings may be formed using a known metal coating method such as electroplating, chemical plating, evaporation, sputtering, or diffusion.

Here, to coat a desired area with a metal, a conventional method such as masking or blasting is applicable.

INDUSTRIAL APPLICABILITY

The present invention can be used for a semiconductor light-emitting device that requires a high luminous efficiency, such as an LED device employed in lighting, indication, decoration, communication, and the like.

The invention claimed is:

1. A lead frame for a semiconductor light-emitting device, comprising:
   a lead frame body; and
   a plurality of metal coatings which are applied to the lead frame body, wherein:
   a predetermined part of the lead frame is formed by extending one pair of inner leads, which are separated by a gap, toward each other in a state where extended portions of the pair of inner leads are flat and flush with each other, the predetermined part being to be enclosed with a package of the semiconductor light-emitting device;
   a semiconductor light-emitting element is to be mounted at a predetermined position of the predetermined part so as to straddle the extended portions;
   the package includes a cover made of a transparent resin and a base made of an insulating resin whose refractive index is different from a refractive index of the cover, the cover being in contact with the predetermined position;
   a portion of the lead frame body being in contact with the base includes a part whose outermost coating is a gold or gold-alloy coating, and another part whose outermost coating is a silver or silver-alloy coating;
   an outermost coating of a part of the predetermined part being in contact with the cover is the silver or silver-alloy coating, and
   the silver or silver-alloy coating is different from the gold or gold-alloy coating.

2. The lead frame of claim 1,
   wherein the plurality of metal coatings further include a nickel or nickel-alloy coating, and a palladium or palladium-alloy coating, and
   the nickel or nickel-alloy coating, the palladium or palladium-alloy coating, the gold or gold-alloy coating, and the silver or silver-alloy coating are applied in the stated order, with the nickel or nickel-alloy coating and the palladium or palladium-alloy coating substantially entirely covering the lead frame body.

3. The lead frame of claim 1,
   wherein the silver or silver-alloy coating substantially entirely covers the lead frame body, and
   the gold or gold-alloy coating is applied over the silver or silver-alloy coating only in a part of the lead frame other than the part of the predetermined part being in contact with the cover.

4. The lead frame of claim 3,
   wherein the plurality of metal coatings further include a nickel or nickel-alloy coating and a palladium or palladium-alloy coating, and
   the nickel or nickel-alloy coating, the palladium or palladium-alloy coating, the silver or silver-alloy coating, and the gold or gold-alloy coating are applied in the stated order, with the nickel or nickel-alloy coating and the palladium or palladium-alloy coating substantially entirely covering the lead frame body.

5. The lead frame of claim 1, wherein the silver or silver-alloy coating has a thickness of 0.1 µm or more.

6. The lead frame of claim 1, wherein a base that is a part of the package is inserted to the lead frame with a portion of the predetermined part being enclosed with the base.

7. The lead frame of claim 1, wherein the semiconductor light-emitting element is mounted on the lead frame to form the semiconductor light-emitting device.

8. A lead frame for a semiconductor light-emitting device, comprising:
   a lead frame body; and
   a plurality of metal coatings which are applied to the lead frame body, wherein
   a predetermined part of the lead frame is formed by extending one pair of inner leads, which are separated by a gap, toward each other in a state where extended portions of the pair of inner leads are flat and flush with each other, the predetermined part being to be enclosed with a package of the semiconductor light-emitting device;

a semiconductor light-emitting element is to be mounted at a predetermined position of the predetermined part so as to straddle the extended portions;

the package includes a cover made of a transparent resin and a base made of an insulating resin whose refractive index is different from a refractive index of the cover, the cover being in contact with the predetermined position;

a portion of the lead frame body being in contact with the base includes a part whose outermost coating is a first metal coating, and another part whose outermost coating is a second metal coating;

an outermost coating of a part of the predetermined part being in contact with the cover is the second metal coating, and the second metal coating has higher light reflectance than the first metal coating.

9. The lead frame of claim 8, wherein the first metal coating comprises gold or gold-alloy and the second metal coating comprises silver or silver-alloy.

10. A lead frame for a semiconductor light-emitting device, wherein the semiconductor light-emitting device includes:
   a package that includes a cover made of a transparent resin and a base made of an insulating resin whose refractive index is different from a refractive index of the cover; and
   a semiconductor light-emitting element,
   the lead frame includes:
   a lead frame body; and
   a plurality of metal coatings which are applied to the lead frame body, wherein:
   a predetermined part of the lead frame is formed by extending one pair of inner leads, which are separated by a gap, toward each other in a state where extended portions of the pair of inner leads are flat and flush with each other, the predetermined part being to be enclosed with the package,
   the semiconductor light-emitting element is to be mounted at a predetermined position of the predetermined part so as to straddle the extended portions,
   the cover is in contact with the predetermined position,
   a portion of the lead frame body being in contact with the base includes a part whose outermost coating is a gold or gold-alloy coating, and another part whose outermost coating is a silver or silver-alloy coating,
   an outermost coating of a part of the predetermined part being in contact with the cover is the silver or silver-alloy coating,
   the silver or silver-alloy coating is different from the gold or gold-alloy coating, and
   a surface of the silver or silver-alloy coating is substantially flat.

11. The lead frame of claim 10,
wherein the gold or gold-alloy coating substantially entirely covers the lead frame body, and
the silver or silver-alloy coating is applied over the gold or gold-alloy coating only in the part of the predetermined part being in contact with the cover.

12. A semiconductor light-emitting device comprising:
a package that includes a cover made of a transparent resin and a base made of an insulating resin whose refractive index is different from a refractive index of the cover;
a semiconductor light-emitting element; and
a lead having a lead body to which a plurality of metal coatings are applied, wherein:

a predetermined part of the lead is formed by extending one pair of inner-leads, which are separated by a gap, toward each other in a state where extended portions of the pair of inner-leads are flat and flush with each other, the predetermined part being enclosed with the package, the semiconductor light-emitting element is mounted at a predetermined position of the predetermined part so as to straddle the extended portions, the cover is in contact with the predetermined position, a portion of the lead body being in contact with the base includes a part whose outermost coating is a gold or gold-alloy coating, and another part whose outermost coating is a silver or silver-alloy coating, an outermost coating of a part of the predetermined part being in contact with the cover is the silver or silver-alloy coating, and the silver or silver-alloy coating is different from the gold or gold-alloy coating.

13. The semiconductor light-emitting device of claim 12, wherein the plurality of metal coatings further include a nickel or nickel-alloy coating, and a palladium or palladium-alloy coating, and the nickel or nickel-alloy coating, the palladium or palladium-alloy coating, the gold or gold-alloy coating, and the silver or silver-alloy coating are applied in the stated order, with the nickel or nickel-alloy coating and the palladium or palladium-alloy coating substantially entirely covering the lead frame body.

14. The semiconductor light-emitting device of claim 12, wherein the silver or silver-alloy coating substantially entirely covers the lead frame body, and the gold or gold-alloy coating is applied over the predetermined part being in contact with the cover.

15. The semiconductor light-emitting device of claim 12, wherein the plurality of metal coatings further include a nickel or nickel-alloy coating, and a palladium or palladium-alloy coating, and the nickel or nickel-alloy coating, the palladium or palladium-alloy coating, the silver or silver-alloy coating, and the gold or gold-alloy coating are applied in the stated order, with the nickel or nickel-alloy coating and the palladium or palladium-alloy coating substantially entirely covering the lead frame body.

16. The semiconductor light-emitting device of claim 12, wherein the silver or silver-alloy coating has a thickness of 0.1 μm or more.

17. The semiconductor light-emitting device of claim 12, wherein:
   the base that is a part of the package is inserted to the semiconductor light-emitting device, and
   a portion of the predetermined part is enclosed with the base.

18. A semiconductor light-emitting device comprising:
a package that includes a cover made of a transparent resin and a base made of an insulating resin whose refractive index is different from a refractive index of the cover;
a semiconductor light-emitting element; and
a lead having a lead body to which a plurality of metal coatings are applied, wherein:
a predetermined part of the lead is formed by extending one pair of inner leads, which are separated by a gap, toward each other in a state where extended portions of the pair of inner leads are flat and flush with each other, the predetermined part being to be enclosed with a package of the semiconductor light-emitting device, a semiconductor light-emitting element is to be mounted at a predetermined position of the predetermined part so as to straddle the extended portions, the cover of the package is in contact with the predetermined position, a portion of the lead body being in contact with the base includes a part whose outermost coating is a first metal coating, and another part whose outermost coating is a second metal coating, an outermost coating of a part of the predetermined part being in contact with the cover is the second metal coating, and the second metal coating has higher light reflectance than the first metal coating.

19. The semiconductor light-emitting device of claim 18, wherein the first metal coating comprises gold or gold-alloy and the second metal coating comprises silver or silver-alloy coating.

20. A semiconductor light-emitting device comprising:
a lead frame;
a package that includes a cover made of a transparent resin and a base made of an insulating resin whose refractive index is different from a refractive index of the cover; and
a semiconductor light-emitting element, wherein the lead frame includes:
   a lead frame body; and
   a plurality of metal coatings which are applied to the lead frame body, wherein:
a predetermined part of the lead frame is formed by extending one pair of inner leads, which are separated by a gap, toward each other in a state where extended portions of the pair of inner leads are flat and flush with each other, the predetermined part being enclosed with the package,
the semiconductor light-emitting element is mounted at a predetermined position of the predetermined part so as to straddle the extended portions,
the cover is in contact with the predetermined position,
a portion of the lead frame body being in contact with the base includes a part whose outermost coating is a gold or gold-alloy coating, and another part whose outermost coating is a silver or silver-alloy coating,
an outermost coating of a part of the predetermined part being in contact with the cover is the silver or silver-alloy coating,
the silver or silver-alloy coating is different from the gold or gold-alloy coating, and
a surface of the silver or silver-alloy coating is substantially flat.

21. The semiconductor light-emitting device of claim 20, wherein the gold or gold-alloy coating substantially entirely covers the lead frame body, and
the silver or silver-alloy coating is applied over the gold or gold-alloy coating only in the part of the predetermined part being in contact with the cover.

22. A semiconductor light-emitting device comprising:
a package that includes a cover made of a transparent resin and a base made of an insulating resin whose refractive index is different from a refractive index of the cover;
a semiconductor light-emitting element; and
a lead having a lead body to which a plurality of metal coatings are applied, wherein:
a predetermined part of the lead is formed by extending one pair of inner-leads, which are separated by a gap, toward each other in a state where extended portions of the pair of inner-leads are flat and flush with each other, the predetermined part being enclosed with the package,
the semiconductor light-emitting element is mounted at a predetermined position of the predetermined part so as to straddle the extended portions,
the cover is in contact with the predetermined position,
a portion of the lead body being in contact with the base includes a part whose outermost coating is a gold or gold-alloy coating, and another part whose outermost coating is a silver or silver-alloy coating;
an outermost coating of a part of the predetermined part being in contact with the cover is the silver or silver-alloy coating,
the part of the predetermined part being in contact with the cover whose outermost coating is the silver or silver-alloy coating is present between the semiconductor light-emitting element and the lead body, the silver or silver-alloy coating being formed on the lead body in vicinity of the semiconductor light-emitting element,
the silver or silver-alloy coating is different from the gold or gold-alloy coating.

23. A semiconductor light-emitting device comprising:
a package that includes a cover made of a transparent resin and a base made of an insulating resin whose refractive index is different from a refractive index of the cover;
a semiconductor light-emitting element: and
a lead having a lead body to which a plurality of metal coatings are applied, wherein:
a predetermined part of the lead is formed by extending one pair of inner-leads, which are separated by a gap, toward each other in a state where extended portions of the pair of inner-leads are flat and flush with each other, the predetermined part being enclosed with the package,
the semiconductor light-emitting element is mounted at a predetermined position of the predetermined part so as to straddle the extended portions,
the cover is in contact with the predetermined position,
a portion of the lead body being in contact with the base includes a part whose outermost coating is a silver or silver-alloy coating, and another part whose outermost coating is not a silver or silver-alloy coating,
an outermost coating of a part of the predetermined part being in contact with the cover is the silver or silver-alloy coating,
another portion of the lead body is adhered to the insulating resin of the base, and
the silver or silver-alloy coating is different from the gold or gold-alloy coating.

24. The semiconductor light-emitting device of claim 23, wherein
the plurality of metal coatings includes a gold or gold metal-alloy coating and a palladium or palladium alloy that are different from each other, and from the silver or silver-alloy coating,
the palladium or palladium-alloy coating is provided, at least, at a portion of the lead body corresponding to the part whose outermost coating is the gold or gold-alloy, and
the portion of the lead body at which the palladium or palladium-alloy coating is provided is strongly adhered to the insulating resin of the base through the gold or gold-alloy coating.

* * * * *